(12) United States Patent
Kitajima

(10) Patent No.: US 10,978,852 B2
(45) Date of Patent: Apr. 13, 2021

(54) LIGHT EMITTING DEVICE

(71) Applicant: NICHIA CORPORATION, Anan (JP)

(72) Inventor: Tadayuki Kitajima, Tokushima (JP)

(73) Assignee: NICHIA CORPORATION, Anan (JP)

(*) Notice: Subject to any disclaimer, the term of this patent is extended or adjusted under 35 U.S.C. 154(b) by 0 days.

(21) Appl. No.: 16/365,975

(22) Filed: Mar. 27, 2019

(65) Prior Publication Data
US 2019/0305512 A1 Oct. 3, 2019

(30) Foreign Application Priority Data

Mar. 27, 2018 (JP) .............................. JP2018-059539

(51) Int. Cl.
H01S 5/022 (2021.01)
H01S 5/024 (2006.01)
H01S 5/042 (2006.01)
H01S 5/40 (2006.01)
H01S 5/00 (2006.01)
(Continued)

(52) U.S. Cl.
CPC .......... H01S 5/02296 (2013.01); H01S 5/005 (2013.01); H01S 5/02469 (2013.01); H01S 5/0425 (2013.01); H01S 5/06825 (2013.01); H01S 5/40 (2013.01); H01S 5/02216 (2013.01)

(58) Field of Classification Search
CPC .... H01S 5/02296; H01S 5/005; H01S 5/0092; H01S 5/02208–02216; H01S 5/0228; F21S 41/16
See application file for complete search history.

(56) References Cited

U.S. PATENT DOCUMENTS

2007/0165684 A1* 7/2007 Hamaoka ............ H01S 5/02244
372/36
2008/0049800 A1* 2/2008 Hasegawa ........... H01S 5/02212
372/43.01
(Continued)

FOREIGN PATENT DOCUMENTS

JP 2015-060159 A 3/2015
JP 2016-122715 A 7/2016

*Primary Examiner* — Tod T Van Roy
*Assistant Examiner* — Sean P Hagan
(74) *Attorney, Agent, or Firm* — Global IP Counselors, LLP

(57) ABSTRACT

A light emitting device includes a package body, a light-transmissive cover, one or more semiconductor laser elements, a wavelength converting member, a wiring, electrically conductive layers, an opaque electrically insulating member, and electrodes. The light-transmissive cover is secured to the package body. The wavelength converting member is disposed above the light-transmissive cover in an optical path of the laser light emitted from the semiconductor laser element. The wiring is disposed on a light incidence surface-side of the wavelength converting member. The electrically conductive layers are electrically connected to the wiring and disposed on an upper surface of the light-transmissive cover. The electrically insulating member at least partially covers the electrically conductive layers and the light-transmissive cover. The electrodes are disposed on a surface of the package body at locations outward of the electrically insulating member in a plan view, and electrically connected to the electrically conductive layers.

20 Claims, 7 Drawing Sheets

(51) Int. Cl.
*H01S 5/068* (2006.01)
*H01S 5/02216* (2021.01)

(56) References Cited

U.S. PATENT DOCUMENTS

| | | | |
|---|---|---|---|
| 2014/0153276 A1* | 6/2014 | Nozaki | F21S 41/43 |
| | | | 362/551 |
| 2015/0085262 A1 | 3/2015 | Ogura | |
| 2015/0292687 A1* | 10/2015 | Sugiyama | H01S 5/02212 |
| | | | 362/259 |
| 2015/0303648 A1* | 10/2015 | Kozuru | H01S 5/005 |
| | | | 362/235 |
| 2015/0372198 A1* | 12/2015 | Daicho | H01L 33/50 |
| | | | 372/44.01 |
| 2016/0131314 A1* | 5/2016 | Waragaya | H01S 5/02212 |
| | | | 362/538 |
| 2017/0063032 A1* | 3/2017 | Morizumi | H01S 5/005 |
| 2017/0122505 A1* | 5/2017 | Kiyota | H01S 5/02276 |
| 2017/0317469 A1* | 11/2017 | Kiyota | H01S 5/02296 |
| 2018/0347785 A1* | 12/2018 | Kawaguchi | F21S 2/00 |
| 2019/0199052 A1* | 6/2019 | Miyoshi | H01S 5/06825 |

* cited by examiner

LIGHT EMITTING DEVICE

CROSS-REFERENCE TO RELATED PATENT APPLICATION

The present application claims priority under 35 U. S. C. § 119 to Japanese Patent Application No. 2018-059539, filed Mar. 27, 2018. The contents of Japanese Patent Application No. 2018-059539 are incorporated herein by reference in their entirety.

BACKGROUND

Technical Field

The present disclosure relates to a light emitting device.

Description of Related Art

There have been known light emitting devices employing one or more semiconductor laser elements. In such light emitting devices, in order to reduce leakage of laser light, a current path is provided by forming an electrically conducting film on a wavelength converting member which is to be irradiated by laser light (for example, illustrated in Japanese Unexamined Patent Publications No. 2015-60159 and No. 2016-122715). That is, when the current path formed on the wavelength converting member is disconnected, it is determined that an abnormality, such as detachment of the wavelength converting member from its predetermined position, occurrence of cracks, or the like has occurred, and the lasing is stopped.

SUMMARY OF THE INVENTION

However, even when cracks occur in the wavelength converting member, if the current path is maintained by, for example, adhesion of a water drop on the electrically conductive film or the like and provides an electrical connection, the occurrence of the cracks may not be detected. Further, light emitting devices are expected to have simpler structures while being capable of detecting such abnormality. The present disclosure is devised in light of such circumstances, and it is hence an object thereof to provide a light emitting device that can reliably detect occurrence of abnormality that may cause leakage of laser light.

A light emitting device according to certain embodiments includes a package body, a light-transmissive cover, one or more semiconductor laser elements, a wavelength converting member, a wiring, electrically conductive layers, an opaque electrically insulating member, and electrodes. The light-transmissive cover is directly or indirectly secured to the package body. The semiconductor laser element is configured to emit a laser light and disposed in a space enclosed by the package body and the light-transmissive cover. The wavelength converting member is disposed above the light-transmissive cover in an optical path of the laser light emitted from the one or more semiconductor laser elements. The wiring is disposed on a light incidence surface-side of the wavelength converting member. The electrically conductive layers are electrically connected to the wiring and disposed on an upper surface of the light-transmissive cover. The opaque electrically insulating member covers at least parts of the electrically conductive layers and a part of the light-transmissive cover. The electrodes are disposed on a surface of the package body at locations outward of the electrically insulating member in a plan view, and electrically connected to the electrically conductive layers.

In the light emitting device as described above, abnormality that may cause leakage of a laser light can be reliably detected and also a reduction in the size of the light emitting device can be realized.

DETAILED DESCRIPTION OF EMBODIMENTS

Figure 1A:
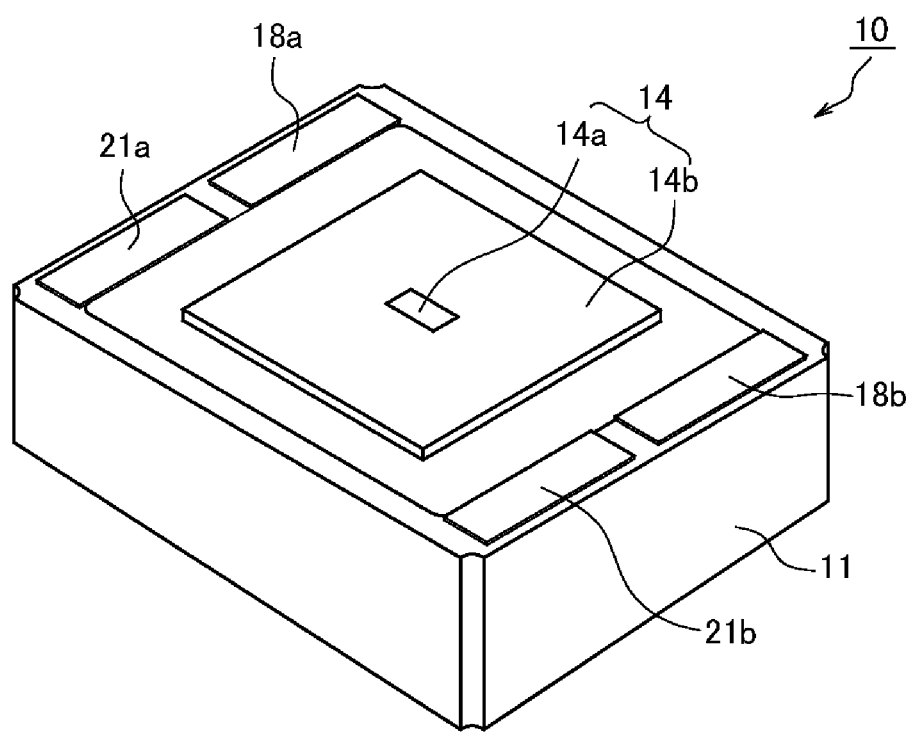
FIG. 1A is a schematic perspective view illustrating a configuration of a light emitting device according to one embodiment of the present invention.

Certain embodiments according to the present invention will be described below with reference to the accompanying drawings. It is to be noted that the light emitting device described below is intended for implementing the technical concept of the present invention, and the present invention is not limited to those described below unless otherwise specified. Note that, the size, positional relationship and the like in the drawings may be exaggerated for the sake of clarity.

Figure 1B:
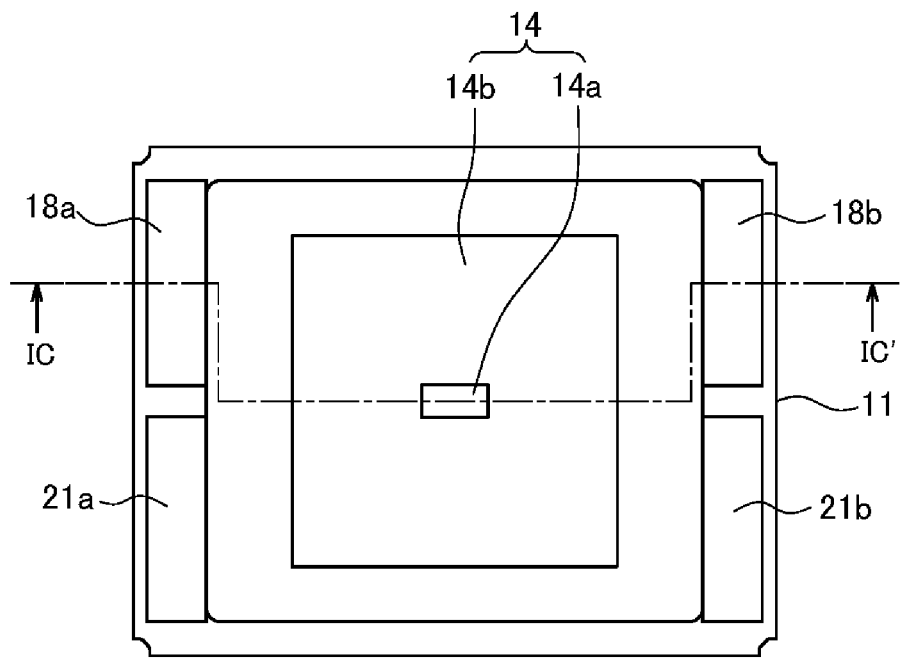
FIG. 1B is a plan view of the light emitting device shown in FIG. 1A.
Figure 1C:
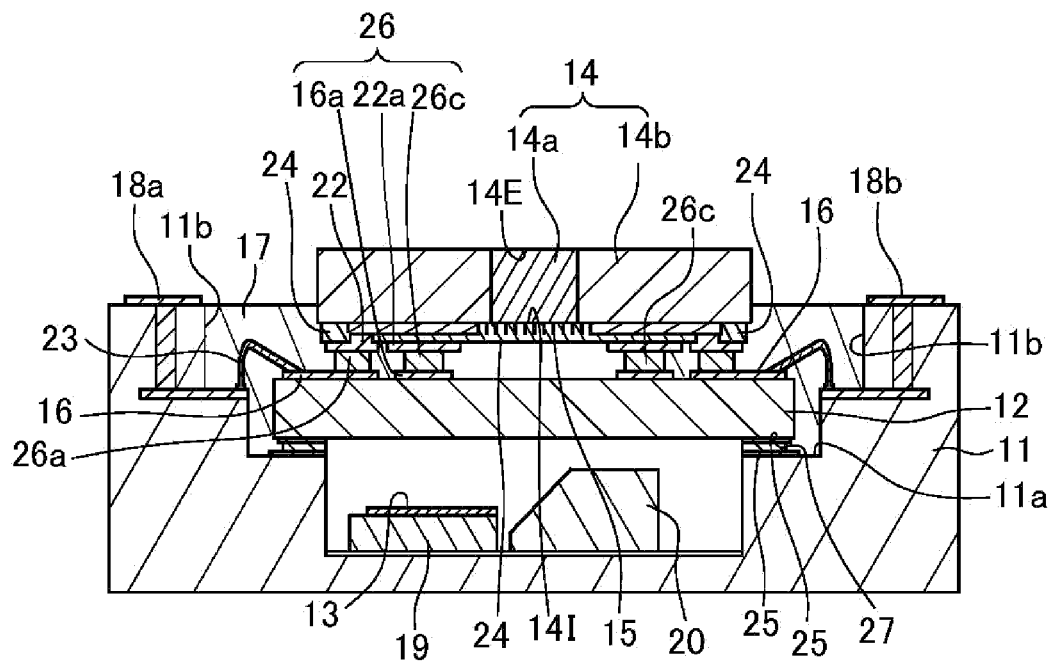
FIG. 1C is a schematic sectional view taken along line IC-IC' of FIG. 1B.

A light emitting device 10 according to one embodiment of the present invention includes, as shown in FIG. 1A to FIG. 1C, a package body 11 and a light-transmissive cover 12, a semiconductor laser element 13, a wavelength converting member 14, a wiring 15 disposed at a light-incident surface side of the wavelength converting member 14, electrically conductive layers 16 disposed on an upper surface of the light-transmissive cover 12, an electrically insulating member 17 covering the electrically conductive layers 16 and the light-transmissive cover 12, and electrodes 18a, 18b disposed on an upper surface of the package body 11. In the present specification, a surface at a light-extracting side (an upper side in FIG. IC) is referred to as an "upper surface" and a surface opposite to the upper surface (a lower side in FIG. 1C) is referred to as a "lower surface", in the light emitting device 10.

In the light emitting device 10 as describe above, abnormality that may result in leakage of laser light can be detected more reliably by using the wiring 15 and the electrically conductive layers 16. That is, the wiring 15 and the electrically conductive layers 16 are covered by the wavelength converting member 14 and the electrically insulating member 17 such that the wiring 15 and the electrically conductive layers 16 are not exposed to the outside. Accordingly, possibility of unintended current paths forming, such as short-circuits, due to adhesion of a water drop or the like on the wiring 15 can be reduced. Further, an opaque electrically insulating member 17 is disposed to cover the electrically conductive layers 16 such that light from the semiconductor laser element 13 can be blocked by the electrically insulating member 17. Accordingly, the light-transmissive cover 12 substantially formed with a light-transmissive material can be used as a member to enclose the semiconductor laser element 13, which can realize further reduction in size of the light emitting device 10.

Package Body 11

The package body 11 is a member constituting a package to house the semiconductor laser element 13. The package further includes a light-transmissive cover 12. The package body 11 defines a recess with an upward opening to house the semiconductor laser element 13. The package body 11 preferably has at least one inner lateral wall part 11b spaced apart from and surrounding the wavelength converting member 14. Accordingly, when a resin material is used for the electrically insulating member 17, the resin material can be stemmed or contained by the inner lateral wall part 11b, and thus the electrically insulating member 17 can be easily disposed. The inner lateral wall part 11b defines a part of the recess. The package body 11 preferably has a protruding surface 11a protruding inward from the inner lateral wall part 11b in a plan view, to secure the light-transmissive cover 12. Accordingly, the light-transmissive member 12 can be stably secured. The protruding surface 11a may be a part of a first step located below the inner lateral wall part 11b, defining another part of the recess. The protruding surface 11a is, for example, a surface substantially in parallel to a lowermost surface of the package body 11. The inner lateral wall part 11b may be in contact with the protruding surface 11a, but as shown in FIG. 1C, two or more steps respectively defining parts of the recess may be arranged and a second step may be provided between the inner lateral wall part 11b and the protruding surface 11a. A metal layer to be connected with the wire 23, which will be described below, can be disposed on the second step.

The package body 11 may be mainly made of ceramics such as aluminum oxide, aluminum nitride, silicon nitride, or silicon carbide, or a metal such as Cu. As shown in FIG. 1C, when electrically conductive members such as metal layers are disposed inside of the package body 11, ceramics is preferably used for the package body 11 to avoid occurrence of short-circuit between the electrically conductive members. The package body 11 has, for example, as shown in FIG. 1B, a quadrangular shape in a plan view.

In this case, the package body 11 preferably has an upper surface adjacent to and surrounding the recess in four sides, in which regions of the upper surface in two of the sides have greater areas than that of other regions of the upper surface in the other two of the sides, to place the electrodes 18a, 18b, 21a, and 21b to be described below.

Power-supplying Electrodes 21a, 21b

The package body 11 includes power-supplying electrodes 21a and 21b to supply power to the semiconductor laser element 13. The power-supplying electrodes 21a and 21b are positive and negative electrodes, respectively. The power-supplying electrodes 21a and 21b are disposed on a surface, for example, on the upper surface, of the package body 11. The power-supplying electrodes 21a and 21b to be electrically connected to the outside are disposed on a surface other than a lower surface of the package body 11, such that an entire portion of the lower surface of the package body 11 can be used for mounting to other members such as a heat sink. Accordingly, dissipation of heat generated from the light emitting device 10 to the heat sink or the like can be facilitated. The light emitting device 10 can be combined with, for example, a heat dissipation plate on which the lower surface of the light emitting device 10 is secured, and connectors respectively connected to the electrodes 18a and 18b, and the power-supplying electrodes 21a and 21b, to structure a light emitting module. In the light emitting module, a height of a light emitting point can be set, for example, in a height from a lower surface of the heat dissipation plate to an upper surface of the wavelength converting member 14 (i.e., a fluorescent material containing part 14a) of the light emitting device 10. The height of the light emitting point can be determined by the respective thicknesses of the heat dissipation plate and the light emitting device 10. When the thicknesses of the light emitting devices 10 tend to deviate, such as when a stacked-layer structure of ceramics is used for the package body 11 of the light emitting device 10, the actual thickness of the light emitting device 10 can be measured and the heat dissipation plate of appropriate thickness can be used in combination. With this arrangement, deviation in the heights of the light emitting points of the light emitting modules can be reduced. Alternatively, dividing the thicknesses of the light emitting devices 10 and the heat dissipation plates into several ranks, and an appropriate combination may be determined for respective ranks. The heat dissipating plate is thermally connected to a heat sink, for example. The power-supplying electrodes 21a and 21b are disposed outward of the electrically insulating member 17. That is, the power-supplying electrodes 21a and 21b are exposed from the electrically insulating member 17. As shown in FIG. 1A, the power-supplying electrode 21a is disposed closer to the electrode 18a and the power supplying electrode 21b is disposed closer to the electrode 18b. Accordingly, terminals of the connectors to supply electricity to the electrodes can be easily disposed. The power-supplying electrodes 21a and 21b are electrically connected to the electrically conductive layer disposed on the bottom surface of the recess of the package body 11 via the electrically conductive members internally disposed of the package body 11. The power-supplying electrodes 21a and 21b can be made of an electrically conductive material such as Au, Sn, Ag, Cu, Ni, Rh, Pd, Al, W, Pt, or Ti, respectively.

Light-Transmissive Cover 12

The light-transmissive cover 12 is directly or indirectly fixed to the package body 11 to enclose the semiconductor laser element 13 and other components in the recess of the package body 11. By hermetically sealing the semiconductor laser element 13 with such fixation, adhesion of dust such as an organic material to the semiconductor laser element 13 can be prevented or reduced. The light-transmissive cover 12 has light-transmissive property, which allows the laser light emitted from the semiconductor laser element 13 to pass through. The light-transmissive cover 12 having a transmittance to the laser light of, for example, 70% or greater, 80% or greater, or 90% or greater, can be employed. For this purpose, the light-transmissive cover 12 can be made of glass, sapphire, or the like. Of those, the light-transmissive cover 12 is preferably made of sapphire, which has a high thermal conductivity. Accordingly, the heat of the wavelength converting member 14 can be dissipated efficiently to the light-transmissive cover 12. When sapphire is used for the light-transmissive cover 12, the thickness may be in a range of 0.1 mm to 5 mm, preferably in a range of 0.3 mm to 1 mm. Accordingly, the mechanical strength of the light-transmissive cover 12 can be securely obtained, and heat dissipation performance can also be improved.

As described above, the light-transmissive cover 12 can be fixed to the protruding surface 11a in the recess of the package body 11. The light-transmissive cover 12 can be directly fixed to the package body 11, by using room-temperature bonding such as surface activated bonding, atomic diffusion bonding, or the like. The light-transmissive cover 12 can be indirectly fixed to the package body 11, for example, as shown in FIG. 1C, via the metal bonding layer 27. The metal bonding layer 27 can be located between the metal layer 25 disposed on a surface of the light-transmissive cover 12 and the metal layer 25 disposed on the protruding surface 11a of the package body 11.

Metal Layer 25

Figure 3A:
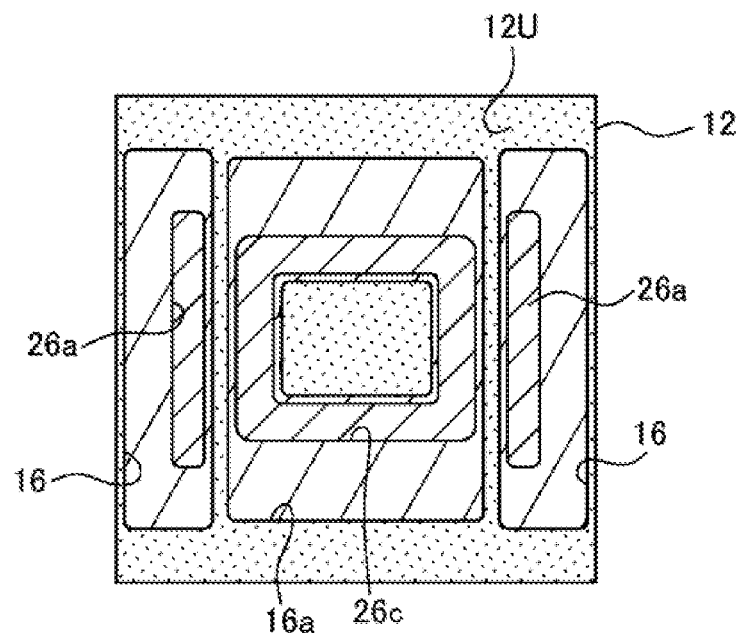
FIG. 3A is a schematic top view of a light-transmissive cover of the light emitting device shown in FIG. 1A.
Figure 3B:
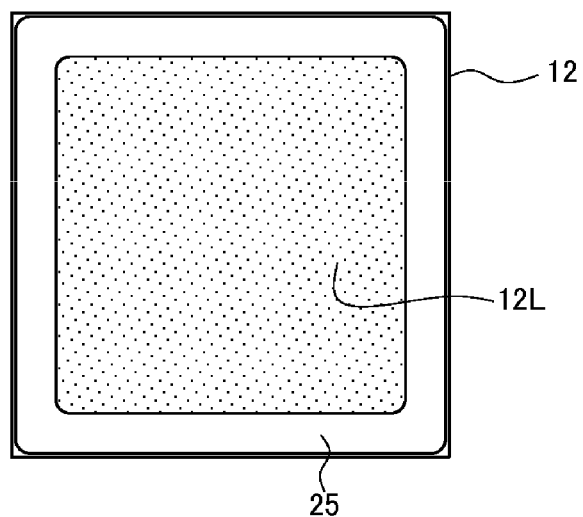
FIG. 3B is a schematic bottom view of the light-transmissive cover of the light emitting device shown in FIG. 1A.

The metal layer 25 can be disposed, for example as shown in a plan view of FIG. 3B, on a peripheral part of the lower surface 12L of the light-transmissive cover 12. In addition, as shown in FIG. 1C, the metal layer 25 may be disposed on the protruding surface 11a of the package body 11. FIG. 3B is a bottom view of the lower surface of the light-transmissive cover 12, in which the light-transmissive part that is not covered by the metal layer 25 is indicated by hatching for the ease of distinguishing the components. The metal layer 25 can be made of a metal material containing at least one selected from a group consisting of Au, Sn, Ag, Cu, Ni, Rh, Pd, Al, W, Pt, and Ti. Examples of the metal material include a layered film of Ti/Pt/Au, or a layered film of W/Ni/Au. The metal layer 25 can have a thickness in a range of, for example, 0.1 µm to 5 µm.

Metal Bonding Layer 27

Examples of the material of the metal bonding layer 27 include solders such as Sn—Bi-based solder, Sn—Cu-based solder, Sn—Ag-based solder, and Au—Sn-based solder; alloys having Au and Sn as main components, alloys having Au and Si as main components; eutectic alloys having Au and Ge as main components; low-melting-point metal brazing materials; and adhesive materials of combination of those. The semiconductor laser element 13 can be sealed by a small number of components, as described above, by using the package body 11 and the light-transmissive cover 12, or by using the package body 11 and the light-transmissive cover 12 respectively having a metal layer or the like on the surface thereof. Accordingly, a reduction in the size of the light emitting device can be realized.

Semiconductor Laser Element 13

The semiconductor laser element 13 is disposed within a space enclosed by the package body 11 and the light-transmissive cover 12. The semiconductor laser element 13 may be directly disposed on the bottom surface defining the recess of the package body 11, but can be disposed on a sub-mount 19 as shown in FIG. 1C. The semiconductor laser element 13 can be mounted such that laser light emitted from the semiconductor laser element 13 propagates in a direction substantially parallel to the bottom surface defining the recess of the package body 11.

The shorter the wavelength of laser light emitted from the semiconductor laser element 13, the higher its energy, which increase demand for detecting leakage of the laser light. The semiconductor laser element 13 can be configured to emit a short-wavelength laser light such as blue light. The semiconductor laser element 13 can be made of nitride-based semiconductor.

The sub-mount 19 may be made of a material whose main component is SiC, AlN, or the like. The semiconductor laser element 13 can be mounted on the sub-mount 19, for example, by using an AuSn eutectic solder or the like.

As shown in FIG. IC, the semiconductor laser element 13 is preferably disposed facing the light-reflecting member 20 that is disposed within the space enclosed by the package body 11 and the light-transmissive cover 12. With this arrangement, laser light emitted from the semiconductor laser element 13 is irradiated on the light-reflecting member 20, and reflected toward the light-transmissive cover 12 fixed to the upper surface side of the package base 11, and can be incident on the wavelength converting member 14 to be described below. For example, the light-reflecting member 20 may be made of glass or Si or the like, having a shape such as triangular prism shape, a quadrangular truncated cone shape, or the like, having a main part that has a surface inclined with respect to a lower surface thereof and a light reflecting film disposed on the inclined surface. The angle of the inclined surface to the lower surface of the main part is preferably about 45 degrees in order to guide the laser light in a direction perpendicular to the lower surface of the package base 11. For the light-reflecting film, a single layer or multilayer dielectric film, a single layer or multilayer metal film, or the like, can be employed.

Wavelength Converting Member 14

The wavelength converting member 14 is configured to convert laser light emitted from the semiconductor laser element 13 to a light of a different wavelength, and has a light-incident surface 14I facing the light-transmissive cover 12 and a light-emitting surface 14E at an opposite side of the light-incident surface 14I. The wavelength converting member 14 preferably has a fluorescent material containing part 14a arranged in an optical path of the laser light, and a light-reflecting part 14b surrounding the fluorescent material containing part 14a. As described above, with the light-reflecting part 14b arranged between the fluorescent material containing part 14a and the electrically insulating member 17, even when the electrically insulating member 17 is also a light-absorption member, a decrease in the optical output of the light emitting device 10 can be avoided or reduced. The fluorescent material containing part 14a of the wavelength converting member 14 is disposed above the light-transmissive cover 12 and in the optical path of the laser light emitted from the semiconductor laser element 13. The light-reflecting part 14b can be disposed to cover lateral surface(s) of the fluorescent material containing part 14a. The term "lateral surface(s) of the fluorescent material containing part 14a" refers to surface(s) connecting the light incidence surface and the light emitting surface of the fluorescent material containing part 14a.

The fluorescent material containing part 14a and the light-reflecting part 14b of the wavelength converting member 14 are preferably made of an inorganic material so they are not easily degraded by irradiation of the laser light. The fluorescent material containing part 14a made of an inorganic material may be ceramics or glass containing a fluorescent material or made of a single crystal of a fluorescent material, which can convert the laser light into light of a different wavelength. Moreover, the wavelength converting member 14 is preferably made of a material that has a high melting point in a range of 1,300° C. to 2,500° C. With the use of such material, good light-resisting properties and good heat resisting properties can be obtained. Thus, occurrence of degradation can be reduced even when irradiated with high-density light such as a laser light.

When ceramics is used for the fluorescent material containing member 14a, for example, a sintered material of a fluorescent material and a light-transmissive material such as aluminum oxide ($Al_2O_3$, melting point in a range of about 1,900° C. to about 2,100° C.) can be used. In this case, the content of the fluorescent material can be in a range of 0.05 volume % to 50 volume %, or in a range of 10 volume % to 40 volume %, with respect to a total volume of the ceramics. Alternatively, ceramics substantially made of only the fluorescent material, obtained by sintering powder of fluorescent material without using such a light-transmissive material, can also be used as the fluorescent material containing part 14a.

Examples of the fluorescent materials include yttrium aluminum garnet (YAG) activated with cerium, lutetium aluminum garnet (LAG) activated with cerium, nitrogen-containing calcium aluminosilicate ($CaO—Al_2O_3—SiO_2$) activated with europium and/or chromium, silicate (($Sr, Ba)_2SiO_4$) activated with europium, α-sialon-based fluorescent material, and β-sialon-based fluorescent material. Of those, a YAG fluorescent material that has good heat-resisting properties is preferably used.

The wavelength converting member 14 includes the light-reflecting part 14b formed with a through hole penetrating along its thickness direction, and a fluorescent material containing part 14a fitted in the through hole. The shape defining the through-hole, that is, the shape of the fluorescent material containing part 14a can be corresponding to the shape of the wavelength converting member 14. Examples thereof include a quadrangular prism-shape, a truncated cone shape, a quadrangular truncated cone shape, or a combination of those shapes, with a shape in a plan view of, for example, a polygonal shape such as a triangular shape or a quadrangular shape, a circular shape, or an elliptic shape.

The wavelength converting member 14 preferably has a thickness of 0.2 mm or greater, in view of mechanical strength, and 2.0 mm or less, in view of minimizing a rise in cost and height of the light emitting device.

The light-reflecting part 14b is preferably made of a material that can reflect the laser light and fluorescent light emitted from the fluorescent material at a high reflectance, and also has a high thermal conductivity to release heat from the fluorescent material containing part 14a retained in the through-hole. Examples of the material having a high reflectance and high thermal conductivity include light-reflecting ceramics, a metal, and a composite of ceramics and metal. The light-reflecting part 14b is preferably made of light-reflecting ceramics with which a high reflectance can be easily obtained. For such light-reflecting ceramics, alumina ($Al_2O_3$) ceramics can be used. Forming the light-reflecting part 14b with a material having a high reflectance allows for extraction of light within the wavelength converting member 14 mainly from the upper surface of the fluorescent material containing part 14a, and thus higher luminance can be achieved. Moreover, laser light irradiated to members other than the fluorescent material containing part 14a can be prevented from leaking to the outside. Further, with the arrangement described above, light from the fluorescent material containing part 14a can be substantially prevented from reaching the electrically insulating member 17. Accordingly, even when the electrically insulating member 17 is formed with a light-absorption material, the optical output of the light emitting device can be maintained.

The light-reflecting part 14b may have a surface coplanar with the light-emitting surface 14E of the fluorescent material containing part 14a (i.e. an uppermost surface of the fluorescent material containing part 14a), or a portion or all of the light-emitting surface 14E of the fluorescent material containing part 14a may be arranged protruding from the upper surface of the light-reflecting part 14b. The uppermost surface of the light-emitting surface 14E (in particular, the uppermost surface of the fluorescent material containing part 14a) of the wavelength converting member 14 is preferably arranged protruding from the upper surface of the package body 11. With this arrangement, light extracted from the wavelength converting member 14 in an upward direction being blocked by the package body 11 can be reduced, and thus, the light extraction efficiency of the light emitting device 10 can be increased.

The wavelength converting member 14 can be formed such that, for example, the fluorescent material containing part 14a made of a molded body (e.g., sintered body) and powder or particle form of a material of the light-reflecting part 14b are integrally molded, or powder or particle form of a material of the fluorescent material containing part 14a and the light-reflecting part 14b made of a molded body are integrally molded, and the integrally molded part is sintered. For sintering, for example, a spark plasma sintering method (SPS method), a hot-pressing method (HP method), or the like, can be used. When alumina is used as a powder form of the light-reflecting part 14b, the sintering temperature in a range of 1,200° C. to 1,800° C. can be used.

The wavelength converting member 14 can be fixed to the light-transmissive cover 12 via the wiring 15 and the electrically conductive layer 16, to be described below. Either an electrically insulating material or an electrically conductive material can be used for fixing the wavelength converting member 14. Fixing the wavelength converting member 14 to the light-transmissive cover 12 can be performed, as shown in FIG. 1C, FIG. 2D, and FIG. 3A and as described below, by disposing a metal layer 22 and an electrically conductive bonding layer 26a and the like, respectively between the wiring 15 and the electrically conductive layer 16. Alternatively, for example, normal temperature bonding as described above may be performed, without using the electrically conductive bonding layer 26a.

Wiring 15

The wiring 15 is disposed at the light incidence surface 14I side of the wavelength converting member 14, where the laser light emitted from the semiconductor laser element 13 is incident. The wiring 15 is made of an electrically conducting material. When at least a portion of the wiring 15 is disposed on the fluorescent material containing part 14a of the wavelength converting member 14, the wiring 15 is preferably formed with a light-transmissive electrically conductive film. Accordingly, absorption of light by the wiring 15 can be reduced. For the light-transmissive electrically conductive film, indium tin oxide (ITO) having a high reflectance to visible light can be used. In a region of the wiring 15 to be electrically connected to the electrically conductive layer 16, which will be described below, in order to increase adhesion to the electrically conductive layer 16, a layered film having an Au layer as an uppermost surface, such as a Ti/Pt/Au layer, is disposed on the ITO layer such that the layered film serves as an uppermost surface of the wiring 15.

The wiring 15 may be disposed on a lower surface of the light-reflecting part 14b or a lower surface of the fluorescent material containing part 14a of the wavelength converting member 14, or alternatively, the wiring 15 may be disposed on the light-reflecting part 14b and extended onto the fluorescent material containing part 14a. The wiring 15 may be disposed in a linear shape with a width in a range of about 5 μm to about 50 μm. The wiring 15 may be disposed continuously between two opposite ends of the wavelength converting member 14. A light-transmissive film may be provided between the wiring 15 and the wavelength converting member 14.

The length, the width, the thickness, the pitch, or the like of the wiring 15 can be appropriately determined according to the dimensions of the wavelength converting member 14, the dimensions of the fluorescent material containing part 14a, or the like. The wiring 15 may have a constant width and thickness, or may have partially different width and thickness. The wiring 15 may be disposed in a shape having either a regularly-formed or randomly-formed bendings or curves.

Figure 4:
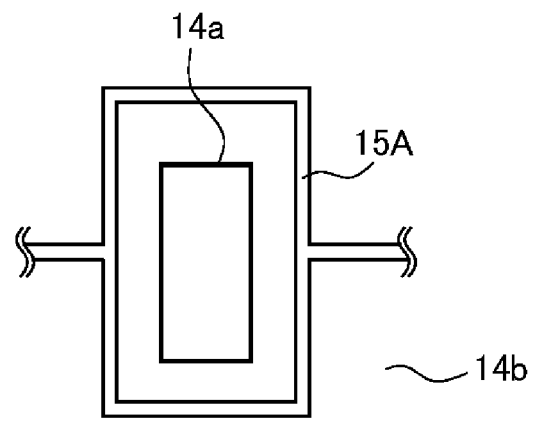
FIG. 4 is a schematic plan view showing a variational example of wirings of the light emitting device shown in FIG. 1A.

More specifically, as shown in FIG. 4, the wiring 15A may be disposed only on the light-reflecting part 14b at the light incidence surface 14I side of the wavelength converting member 14. The wiring 15A may completely surround the fluorescent material containing part 14a in a plan view, as shown in FIG. 4, or may surround only a portion of the fluorescent material containing part 14a in a plan view.

Figure 2A:
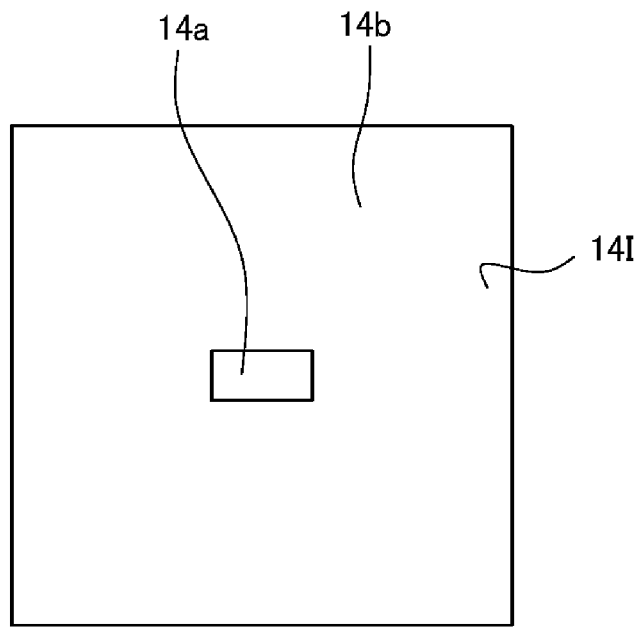
FIGS. 2A to 2D are schematic diagrams for illustrating forming of the wiring of the light emitting device shown in FIG. 1A.
Figure 2B:
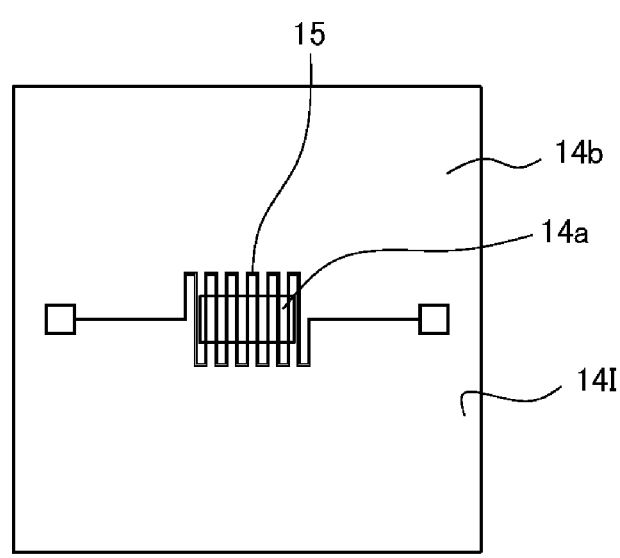

The wiring 15 can be disposed, for example as shown in FIG. 2A, by providing the wavelength converting member 14, and depositing a film of the material for the wiring 15 by using a sputtering method, chemical vapor deposition method, atomic layer deposition method, or the like, on the light incidence surface 14I of the wavelength converting member 14, as shown in FIG. 2B.

Insulating Film 24

Figure 2C:
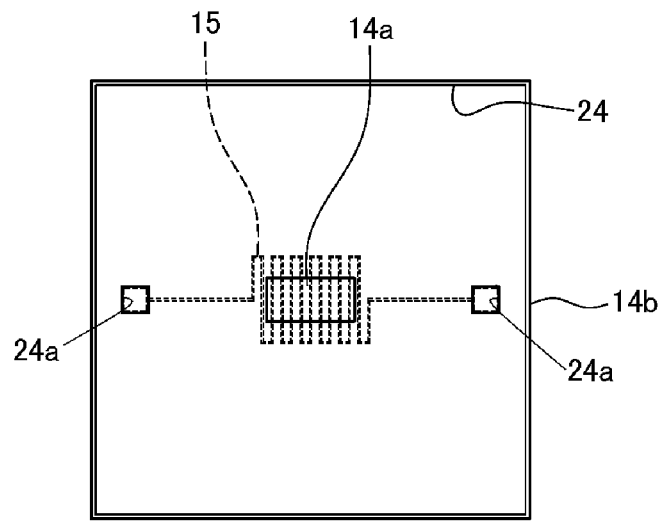
Figure 2D:
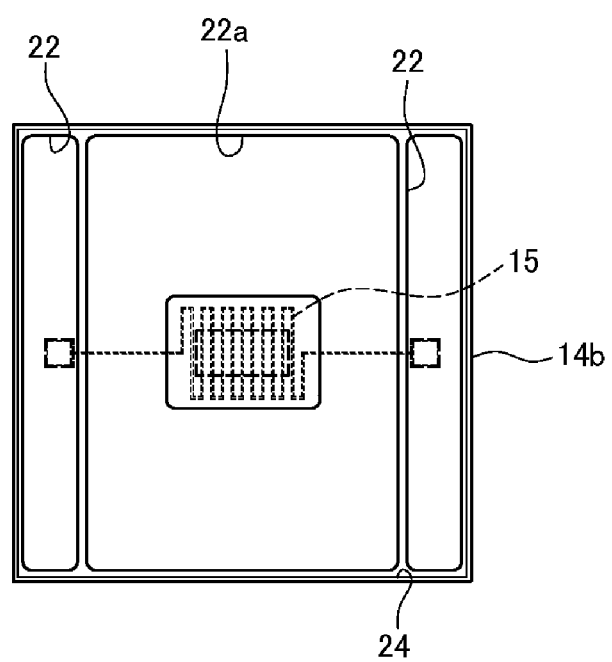

The wiring 15 is preferably covered by the electrically insulating layer 24. With the electrically insulating film 24, the metal film 22a to be described below and the wiring 15 can be insulated from each other, allowing for greater planar dimension for the metal film 22a. The electrically insulating film 24 can be disposed, for example as shown in FIG. 2C, on substantially an entire surface of the light incidence surface 14I of the wavelength converting member 14, except for the openings 24a that expose portions of the wiring 15 at the both ends of the wiring 15. The electrically insulating film 24 is preferably a light-transmissive film when disposed in the optical path of the laser light. With this arrangement, absorption of the laser light by the insulating layer 24 can be reduced. Examples of the light-transmissive film include a film containing an oxide of silicon such as $SiO_2$. The thickness of the electrically insulating film 24 may be, for example, in a range of 1 μm to 15 μm.

Metal Layer 22

As shown in FIG. 2D, in order to facilitate electrical connection to the electrically conductive layers 16 to be described below, metal films 22 are preferably formed under the electrically insulating films 24 (i.e., in a direction away from the wavelength converting member 14), in a region under the light incidence surface 14I of the wavelength converting member 14. The metal films 22 can be electrically connected to a respective part of the wiring 15 through the through-openings 24a defined in the electrically insulating film 24 near the opposite ends of the wiring 15. The planar area of the metal film 22 is greater than the planar area defining the opening 24a. In addition, at the light incidence surface 14I of the wavelength converting member 14, the metal films 22a may be disposed to surround the wiring 15 disposed on the fluorescent material containing part 14a. The metal films 22a can be formed at the same time with the metal films 22 used to connect to the electrically conductive layer 16. The metal films 22a can be used as a part of the surrounding member 26 to be described below.

Electrically Conductive Layers 16

The electrically conductive layers 16 are disposed on the upper surface of the light-transmissive cover 12, and are electrically connected to respective parts of the wiring 15. In a plan view, the electrically conductive layer 16 can be disposed such that at least a part of the electrically conductive layer 16 is overlapped with the wiring 15. For example, as shown in FIG. 3A, the electrically conductive layers 16 are preferably overlapped with respective end parts of the wiring 15. The electrically conductive layers 16 preferably have locations and dimensions so as not to overlap with parts of the fluorescent material containing part 14a. With this arrangement, light incident on the fluorescent material containing part 14a can be prevented from being blocked or intervened by the electrically conductive layers 16. FIG. 3A is a schematic top view, but in order to facilitate recognition of the members, the members are shown by hatching. The electrically conductive layers 16 can be made of an electrically conducting material. Examples of the material of the electrically conductive layers 16 include a single film or a layered film made of one or more metals such as Au, Sn, Ag, Cu, Ni, Rh, Pd, Al, W, Pt, and Ti or one or more alloys of those. For example, a layered film of Ti/Pt/Au/Au—Sn alloy may be used. The thickness of the electrically conductive layers 16 can be, for example, in a range of 0.2 μm to 10 μm. Also, as shown in FIG. 3A, an electrically conductive layer 16a may be disposed on the upper surface 12U of the light-transmissive cover 12 such that the electrically conductive layer 16a surrounds the wiring 15 disposed on the fluorescent material containing part 14a. The electrically conductive layer 16a can be disposed simultaneously with the electrically conductive layers 16 that are provided to be connected to the wiring 15. The electrically conductive layer 16a can be used as a part of a surrounding member 26 to be described below.

Electrically Insulating Member 17

The electrically insulating member 17 is disposed to cover the electrically conductive layers 16 and the light-transmissive cover 12. The electrically insulating member 17 does not necessarily have to cover the entire surfaces of the electrically conductive layers 16 and the light-transmissive cover 12. It is sufficient for the electrically insulating member 17 to cover the upper surfaces and lateral surfaces of the electrically conductive layers 16 and the upper surface of the light-transmissive cover 12. As described above, when the package body 11 has an inner lateral wall part 11b spaced apart from and surrounding the wavelength converting member 14, the electrically insulating member 17 can be disposed to fill between the wavelength converting member 14 and the inner lateral wall part 11b. In other words, the inner lateral wall part 11b can be used to block the flow of the material of the electrically insulating member 17. Further, if a gap is present between the light-transmissive cover 12 and the package body 11, it is more preferable that the electrically insulating member 17 is also disposed to fill the gap. In other words, it is more preferable that the lateral surfaces of the light-transmissive cover 12 are also covered by the electrically insulating member 17. As described above, with the electrically insulating member 17 filled between the light-transmissive cover 12 and/or the wavelength converting member 14 or the like, and the package body 11, heat dissipation performance can be improved compared to the case in which such a gap is filled with air. This is thought to be the reason why dissipation of heat from the wavelength converting member 14 is improved. The electrically insulating member 17 is preferably disposed to completely cover the wires 23, in other words, it is preferable that the wires 23 are not exposed from the electrically insulating member 17. Accordingly, the wires 23 can be protected by the electrically insulating member 17, and also forming of electrical connection caused by adhesion of water drop or the like onto the wires 23 can be prevented. For a similar reason, as shown in FIG. 1C, the electrically conductive layers on the surfaces of the package body 11 to which the wires 23 are connected, are also preferably covered by the electrically insulating member 17.

The electrically insulating member 17 is preferably made of an opaque material, and more preferably, the electrically insulating member 17 also serves as a light-absorption member. With the use of the electrically insulating member 17 that is also a light-absorption member, light from the semiconductor laser element 13 is thought to be reliably blocked compared to the case in which the electrically insulating member 17 is a light-reflecting member. The electrically insulating member 17 is preferably made of a resin material, which can facilitate disposing the electrically insulating member 17 into the gap or the like between the light-transmissive cover 12 and the package body 11. In order to make the electrically insulating member 17 opaque and/or light-absorbing, a light diffusing material and/or a light-absorbing filler material can be contained in the resin. Examples of the resin include an epoxy resin, a silicone resin, an acrylate resin, a urethane resin, a phenol resin, and a BT resin. Examples of light-absorption filler include a dark pigment such as carbon black. With the use of the light-absorbing electrically insulating member 17 as described above, leaking light such as leaking laser light can be reliably blocked compared to the use of a light-reflecting electrically insulating member 17. Note that in FIG. 1C, the electrically insulating member 17 is disposed to a middle of the lateral surfaces of the wavelength converting member 14, but if a resin is used for the electrically insulating member 17, the electrically insulating member 17 may rise along the lateral surfaces of the wavelength converting member 14 to the upper edge of the lateral surfaces by surface tension.

Electrodes 18a, 18b

The electrodes 18a and 18b are disposed on a surface, for example, the upper surface, of the package body 11. The electrodes 18a and 18b are disposed outward of the electrically insulating member 17. That is, the electrodes 18a and 18b are exposed from the electrically insulating member 17. The electrodes 18a and 18b are electrically connected to the respective electrically conductive layers 16 such that electric power can be applied on the wiring 15 via the electrically conductive layers 16. Accordingly, change in the value of electric voltage in the wiring 15 described above can be detected, which can allow detection of damage of wavelength converting member 14, in particular, damage of the fluorescent material containing part 14a. In the present specification, the term "damage" as used above refers to crack(s), deviation in the position, or the like, for example. In order to apply electric voltage to the wiring 15, at least two electrodes of a first electrode and a second electrode are disposed as the electrodes 18a and 18b. The electrodes 18a and 18b that are the first electrode and the second electrode are, as shown in FIG. 1B, preferably disposed on opposite sides with respect to the wavelength converting member 14 on the package base body 11, in a plan view. With the arrangement as described above, a large distance can be provided between the electrode 18a and the electrode 18b. Accordingly, occurrence of short-circuit between the electrodes due to water drop(s) or the like can be efficiently reduced or prevented.

The electrodes 18a and 18b are respectively electrically connected to the respective electrically conductive layers 16. As shown in FIG. 1C, the electrically conductive layers 16 are electrically connected to the metal layers disposed on the package body 11 via the wires 23, and the metal layers can be electrically connected to the electrodes 18a and 18b via the electrically conductive members internally disposed of the package body 11, respectively. The electrodes 18a and 18b can be made of an electrically conducting material such as Au, Sn, Ag, Cu, Ni, Rh, Pd, Al, W, Pt, or/and Ti.

It is preferable that on the surface of the package body 11, one of the electrodes 18a and 18b and one of the power supplying electrodes 21a and 21b are closely disposed, and the other one of the electrodes 18a and 18b and the other one of the power supplying electrodes 21a and 21b are closely disposed, respectively. This arrangement can facilitate designing of the terminals of the module to which the light emitting device 10 is to be incorporated. For example, as shown in FIG. 1B, when the package body 11 has a substantially quadrangular shape in a plan view, the electrode 18a and the power-supplying electrode 21a can be disposed along one side, and the other electrode 18b and the other power-supplying electrode 21b can be disposed along an opposite side of the one side.

Figure 5:
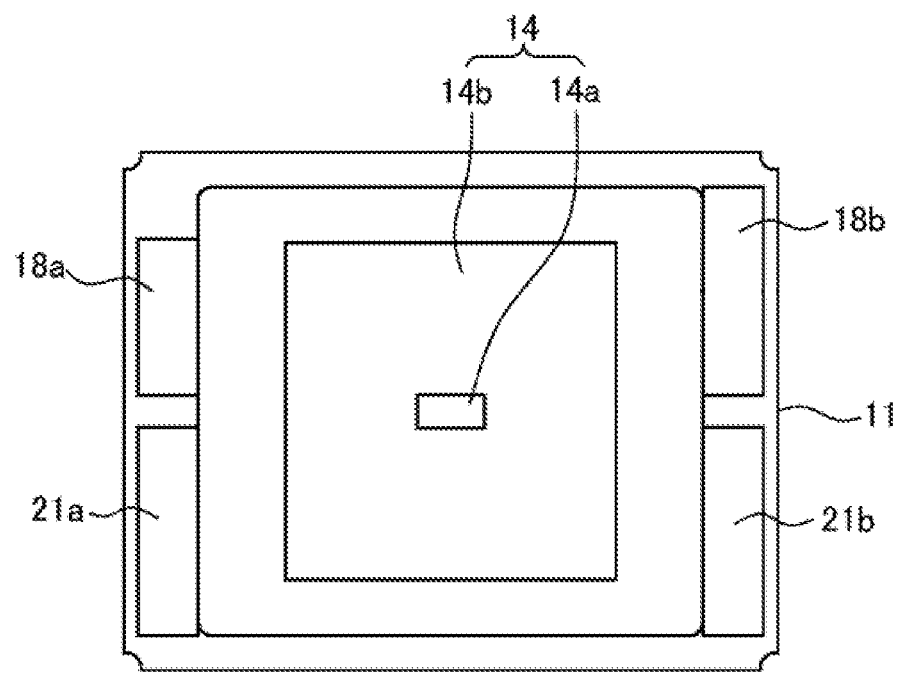
FIG. 5 is a schematic plan view showing a variational example of the light emitting device.

As shown in FIG. 5, at least one of the electrodes 18a, 18b, the power-supplying electrodes 21a, 21b (for example, the electrode 18a in FIG. 5) may have smaller planar dimensions than that of other electrodes. Such an arrangement allows for determining the orientation of the light emitting device 10. For example, the power supplying electrode at the side with smaller electrode can be determined as a cathode. The exposed surface of the package body 11 obtained by forming certain electrode (s) with smaller planar dimensions can be used for applying a pattern such as a production serial number. Examples of such a pattern include a two-dimensional code. The electrode having smaller planar dimensions is preferably an electrode other than the power supplying electrode 21a or 21b. This is because the power supplying electrodes 21a and 21b supply electric power to the semiconductor laser element 13 and tend to be loaded with larger electric current than other electrode(s).

Surrounding Member 26

It is preferable that the emitting device 10 further includes a surrounding member 26. The surrounding member 26 is, as shown in FIG. 1C, disposed on the lower surface of the wavelength converting member 14 and/or the upper surface of the light-transmissive cover 12, and as shown in FIG. 3A, encircles the region of the wavelength converting member 14 to which the laser light is to be incident. With the surrounding member 26, the electrically insulating member 17 can be prevented from entering the optical path of the laser light. In particular, when a resin is used for the electrically insulating member 17, the resin easily enters gaps, and thus, it is preferable to provide the surrounding member 26. The surrounding member 26 is, for example, formed with an electrically conductive layer 16a, a metal layer 22a, and a bonding material 26c. The surrounding member 26 is preferably disposed inward of the electrically conductive bonding layer 26a, in other words, between the electrically conductive bonding layer 26a and the light incident region of the wavelength converting member 14 on which the laser light is incident. Such an arrangement is preferable because as shown in FIG. 1C, the wires 23 are connected to the electrically conductive layers 16 that are connected to the electrically conductive bonding layers 26a. The surrounding member 26 can be disposed to completely surround the light-incident region. The surrounding member 26 can be disposed, for example, to demarcate the region that is directly under the fluorescent material containing part 14a, or to demarcate a region smaller or larger than the region that is directly under the fluorescent material containing part 14a. In particular, the surrounding member 26 is preferably disposed to demarcate a region slightly larger than the region that is directly under the fluorescent material containing part 14a. This arrangement can prevent light incident on the fluorescent material containing part 14a from being blocked or intervened by the surrounding member 26. When the wiring 15A is disposed only on the light-reflecting part 14b at the light incidence surface 14I side of the wavelength converting member 14, to surround at least a portion of the fluorescent material containing part 14a in a plan view, the surrounding member 26 can also be disposed to surround the portion of the wiring 15A that surrounds at least a portion of the fluorescent material containing part 14a, in the plan view.

The surrounding member 26 can be made of either an electrically insulating material or an electrically conductive material, or a composite material of those. The electrically insulating material can be made of a similar material used for the electrically insulating member 17, the package body 11, the light-reflecting part 14b, or the electrically insulating film 24. The electrically conducting material can be made of a similar material used for the wiring 15, electrically conductive layers 16, the metal film 22, the metal layer 25, or the metal bonding layer 27. In particular, the surrounding member 26 is preferably made of a member similar to those used to establish electrical connection between the wiring 15 and the electrically conductive layers 16, because of the ease of forming. For example, the surrounding member 26 can be formed with a metal layer 22a as shown in FIG. 1C and FIG. 2D, an electrically conductive layer 16a as shown in FIG. 1C and FIG. 3A and a bonding material 26c disposed between the metal film 22a and the electrically conductive layer 16a as shown in FIG. 1C and FIG. 3A. The bonding material 26c can be a material similar to the material of the metal bonding layer 27 as described above. When the surrounding member 26 is formed with such members as described above, a sum of the thicknesses of those members preferably corresponds to a height that can close the gap between the wavelength converting member 14 and the light-transmissive cover 12. Accordingly, the electrically insulating member 17 can be prevented from entering the optical path of the laser light. It is preferable that the surrounding member 26 is disposed with a height corresponding to the height that can close the gaps between the wavelength converting member 14 and the light-transmissive cover 12, even when the enclosing member 26 is formed with a material or materials other than that described above.

Detection Circuit

The detection device 10 can be further equipped with a detection circuit configured to detect a change in the resistance values caused by damage of the wiring 15. The detection circuit can be connected to the wiring 15 and a power supply circuit for the semiconductor laser element 13. With such a detection circuit, damage of the wavelength converting member 14 can be detected as a change in the resistance values caused by damage of the wiring 15. Accordingly, at the time of detecting a change in the resistance value of the wiring 15, occurrence of damage to the wavelength converting member 14 and the light-reflecting part 14b can be determined, and the operation of the semiconductor laser element 13 is stopped. Accordingly, leakage of the laser light can be prevented.

Figure 6:
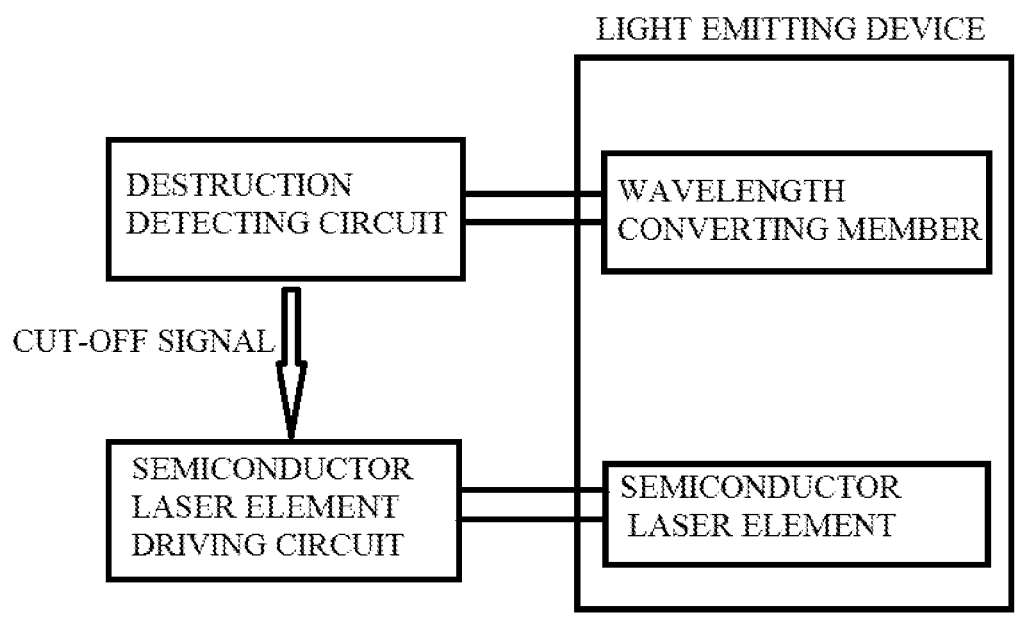
FIG. 6 is a functional block diagram of a driving device of the light emitting device.

An example of a functional block diagram of the driving device of the light emitting device is illustrated in FIG. 6. In FIG. 6, a destruction detecting circuit is used as the detection circuit, and the wiring 15 disposed on the wavelength converting member 14 is connected to the destruction detecting circuit. Upon detecting damage of the wiring 15, the destruction detecting circuit transmits a cut-off signal, and the semiconductor laser element driving circuit stops the operation of the semiconductor laser element upon receiving the cut-off signal.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
   a package body;
   a light-transmissive cover directly or indirectly secured to the package body, the light-transmissive cover being substantially made of a light-transmissive material;
   one or more semiconductor laser elements configured to emit a laser light and disposed in a space enclosed by the package body and the light-transmissive cover;
   a wavelength converting member disposed above the light-transmissive cover in an optical path of the laser light emitted from the one or more semiconductor laser elements, an outermost edge of the wavelength converting member being disposed inwardly of an outermost edge of the light-transmissive cover in a plan view;
   a wiring disposed on a light incidence surface-side of the wavelength converting member;
   electrically conductive layers electrically connected to the wiring and disposed on an upper surface of the light-transmissive cover;
   an opaque electrically insulating member covering at least parts of the electrically conductive layers and a part of the upper surface of the light-transmissive cover; and
   electrodes disposed on a surface of the package body at locations outward of the electrically insulating member in the plan view, and electrically connected to the electrically conductive layers.

2. The light emitting device according to claim 1, wherein the electrically insulating member is a light-absorption member.

3. The light emitting device, according to claim 1, wherein
the wavelength converting member includes
a fluorescent material containing part disposed in the optical path of the laser light emitted from the one or more semiconductor laser elements, and
a light-reflecting part surrounding a lateral periphery of the fluorescent material containing part in the plan view.

4. The light emitting device according to claim 3, wherein the wiring is disposed only on the light-reflecting part at the light incidence surface-side of the wavelength converting member.

5. The light emitting device according to claim 3, wherein a portion or all of a light-emitting surface of the fluorescent material containing part protrudes from an upper surface of the light-reflecting part.

6. The light emitting device according to claim 1, wherein the electrodes include a first electrode and a second electrode disposed at opposite sides with respect to the wavelength converting member in the plan view.

7. The light emitting device according to claim 1, wherein the package body includes power supplying electrodes disposed on the upper surface of the package body at locations outward of the electrically insulating member in the plan view to supply electric power to the one or more semiconductor laser elements.

8. The light emitting device according to claim 7, wherein
the electrodes include a first electrode and a second electrode disposed at opposite sides with respect to the wavelength converting member in the plan view,
the power supplying electrodes include a first power supplying electrode and a second power supplying electrode disposed at opposite sides with respect to the wavelength converting member in the plan view, and
at least one of the first electrode, the second electrode, the first power supplying electrode and the second power supplying electrode has a smaller planar dimension than that of other electrodes.

9. The light emitting device according to claim 7, wherein
the electrodes include a first electrode and a second electrode disposed at opposite sides with respect to the wavelength converting member in the plan view,
the power supplying electrodes include a first power supplying electrode and a second power supplying electrode disposed at opposite sides with respect to the wavelength converting member in the plan view, and
one of the first electrode and the second electrode and one of the first power supplying electrode and the second power supplying electrode are disposed adjacent to each other, and the other one of the first electrode and the second electrode and the other one of the first power supplying electrode and the second power supplying electrode are disposed adjacent to each other.

10. The light emitting device according to claim 1, wherein
the package body includes at least one inner lateral wall part spaced apart from and surrounding the wavelength converting member, and
the electrically insulating member is filled between the wavelength converting member and the at least one inner lateral wall part.

11. The light emitting device according to claim 1 further comprising
a surrounding member disposed on a lower surface of the wavelength converting member and surrounding a light-incident region of the lower surface of the wavelength converting member in which the laser light from the one or more semiconductor laser element is irradiated.

12. The light emitting device according to claim 11, wherein
the wavelength converting member includes a fluorescent material containing part disposed in the optical path of the laser light emitted from the one or more semiconductor laser elements, and
the surrounding member includes a metal film that surrounds the wiring disposed on the fluorescent material containing part at the light incidence surface-side of the wavelength converting member.

13. The light emitting device according to claim 11, wherein
the wavelength converting member includes a fluorescent material containing part disposed in the optical path of the laser light emitted from the one or more semiconductor laser elements, and
the surrounding member includes an additional electrically conductive layer disposed on the upper surface of the light-transmissive cover and surrounding the wiring disposed on the fluorescent material containing part.

14. The light emitting device according to claim 1, wherein
the wavelength converting member has an uppermost surface located higher than an uppermost surface of the package body.

15. The light emitting device according to claim 1, wherein
the light-transmissive cover is made of sapphire.

16. The light emitting device according to claim 1, wherein
the wiring is disposed continuously between two opposite ends of the wavelength converting member.

17. The light emitting device according to claim 1, further comprising
an insulating layer covering the wiring on the light incidence surface-side of the wavelength converting member, the insulating layer defining through-openings through which parts of the wiring are exposed, and
a metal film electrically connected to the parts of the wiring through the through-openings and electrically connected to the electrically conductive layer.

18. The light emitting device according to claim 1, wherein
the light-transmissive cover is secured on a protruding surface defining a part of a recess formed in the package body.

19. The light emitting device according to claim 18, wherein
the protruding surface is a part of a first step located below an inner lateral wall part which is spaced apart from and surrounds the wavelength converting member.

20. The light emitting device according to claim 1, wherein
the package body is spaced apart from the light-transmissive cover, and
the electrically insulating member is filled between the light-transmissive cover and the package body.

* * * * *